United States Patent
Wang et al.

(10) Patent No.: US 9,667,267 B2
(45) Date of Patent: May 30, 2017

(54) DITHER CIRCUIT FOR HIGH-RESOLUTION ANALOG-TO-DIGITAL CONVERTERS

(71) Applicant: China Electronic Technology Corporation, 24th Research Institute, Chongqing (CN)

(72) Inventors: Yan Wang, Chongqing (CN); Gang-Yi Hu, Chongqing (CN); Tao Liu, Chongqing (CN); Yu-Xin Wang, Chongqing (CN); Jian-An Wang, Chongqing (CN); Dong-Bing Fu, Chongqing (CN); Ting Li, Chongqing (CN); Guang-Bing Chen, Chongqing (CN)

(73) Assignee: CHINA ELECTRONIC TECHNOLOGY CORPORATION, 24TH RESEARCH INSTITUTE, Chongqing (CN)

( * ) Notice: Subject to any disclaimer, the term of this patent is extended or adjusted under 35 U.S.C. 154(b) by 0 days.

(21) Appl. No.: 15/121,381

(22) PCT Filed: Jan. 28, 2015

(86) PCT No.: PCT/CN2015/071683
§ 371 (c)(1),
(2) Date: Aug. 24, 2016

(87) PCT Pub. No.: WO2016/119133
PCT Pub. Date: Aug. 4, 2016

(65) Prior Publication Data
US 2016/0373128 A1    Dec. 22, 2016

(30) Foreign Application Priority Data
Jan. 26, 2015    (CN) .......................... 2015 1 0038151

(51) Int. Cl.
    *H03M 1/20*    (2006.01)
    *H03M 1/10*    (2006.01)
    (Continued)

(52) U.S. Cl.
    CPC ......... H03M 1/201 (2013.01); H03M 1/0641 (2013.01); H03M 1/1009 (2013.01);
    (Continued)

(58) Field of Classification Search
    CPC ......... H03M 1/201; H03M 1/245; H03M 1/46
    (Continued)

(56) References Cited

U.S. PATENT DOCUMENTS

| 4,914,439 A | 4/1990 | Nakahashi et al. |
| 5,187,481 A * | 2/1993 | Hiller ................ H03H 21/0012 341/131 |

(Continued)

FOREIGN PATENT DOCUMENTS

CN    103560800 A    2/2014

OTHER PUBLICATIONS

Jin-Shan Yu, Sheng-Ming Liang, Zhuo Ma, Yu-Rin Wang, Rui-Tao Zhang, Tao Liu, Zhou Yu, "Dither Circuit to Improve Performance for a Radiation Hardening by Design Pipeline Anglog to Digital Converter", Journal of Shanghai Jiao Tong University, Jan. 2013, pp. 129-132 and 137, No. 1, vol. 47, China Academic Journal Electronic Publishing House, China.

*Primary Examiner* — Peguy Jean Pierre
(74) *Attorney, Agent, or Firm* — Cheng-Ju Chiang

(57)    ABSTRACT

A dither circuit for high-resolution analog-to-digital converters (ADCs) is presented, including a settable pseudorandom sequence generator, a trimming module, a trimmable digital-to-analog conversion circuit, a dither introduced circuit and a dither elimination circuit, wherein the settable pseudorandom sequence generator works to
(Continued)

generate pseudorandom sequence signal uncorrelated to analog input signal and its output can be set, of which n bit output is taken as digital dither signal and n can be less than the quantization bit of the ADC; the trimming module works to determine the trimming signals for the trimmable digital-to-analog conversion circuit to convert the digital dither signal into analog dither signal precisely; the dither introduced circuit works to introduce the analog dither signal to the ADC; the dither elimination circuit works to remove the digital dither signal from the output of ADC. The dither circuit features less complexity and better dynamic performance for high-resolution ADC.

8 Claims, 8 Drawing Sheets

(51) Int. Cl.
H03M 1/12 (2006.01)
H03M 1/46 (2006.01)
H03M 1/06 (2006.01)
H03M 1/74 (2006.01)

(52) U.S. Cl.
CPC ........... *H03M 1/1245* (2013.01); *H03M 1/46* (2013.01); *H03M 1/1061* (2013.01); *H03M 1/742* (2013.01)

(58) Field of Classification Search
USPC ..................... 341/131, 144, 155, 118, 120
See application file for complete search history.

(56) References Cited

U.S. PATENT DOCUMENTS

| | | | |
|---|---|---|---|
| 7,015,851 B1* | 3/2006 | Bruhns | H03M 1/0646 341/131 |
| 7,221,299 B2 | 5/2007 | Bjornsen | |
| 7,277,033 B1* | 10/2007 | Kriz | H03M 1/06 341/131 |
| 8,497,790 B1* | 7/2013 | Lewis | H03M 1/1019 341/118 |
| 2012/0013494 A1* | 1/2012 | Song | H03M 1/12 341/122 |
| 2013/0120171 A1* | 5/2013 | Dinc | H03M 1/0641 341/110 |

* cited by examiner

DITHER CIRCUIT FOR HIGH-RESOLUTION ANALOG-TO-DIGITAL CONVERTERS

CROSS REFERENCE TO RELATED APPLICATIONS

The present application is a 35 U.S.C. §371 National Phase conversion of International (PCT) Patent Application No. PCT/CN2015/071683, filed on Jan. 28, 2015, the disclosure of which is incorporated by reference herein. The PCT International Patent Application was filed and published in Chinese.

FIELD OF THE DISCLOSURE

The invention relates to analog-to-digital converters, particularly to a dither circuit for high-resolution analog-to-digital converters.

BACKGROUND OF THE DISCLOSURE

In communication system, either wideband or narrowband receiver often operate with signals well below full scale. And it is required that the analog-to-digital converter feature good Spurious Free Dynamic Range (SFDR).

As to high-speed high-resolution analog-to-digital converters (ADCs), SFDR is determined by two factors: 1. the distortion of the front-end amplifier and sample-and-hold circuit; 2. the distortion brought by non-linearity of transfer function of ADC, namely, differential nonlinearity (DNL). When input signal features small amplitude, the front-end amplifier and sample/hold circuit feature good linearity, so the distortion brought by front-end amplifier and sample/hold circuit can be ignored. However, even insignificant non-linearity of ADC's transfer function cause harmonics. Particularly, when input signal amplitude and quantization step feature the same order of magnitude, the distortion can be serious in ways that decrease SFDR. Therefore, when input signal features small amplitude, DNL error must be reduced to increase ADC's SFDR.

At present, a noise dither technique to decrease DNL error of ADC and improve SFDR is shown in FIG. 1: The analog-to-digital converter system is taken as a "Black box". A pseudorandom sequence signal, as a dither signal, goes through the digital-to-analog converter (DAC) and comes out as an analog dither signal. The analog dither signal is added to the analog input signal, then being quantized by ADC system. The dither signal is eliminated by digital subtracter in the digital domain before the output of final digital code.

Technically, it is very difficult to effectively remove dither signals, because the analog dither signal being injected to analog front-end, is required to equal to the dither signal being eliminated in the digital domain. Otherwise, the output of final digital code consists of tremendous information about dither signals which increases noise floor of ADC. It is clear that higher resolution is required for DAC in such situation, and the digital-to-analog converter is required to have the same quantization bits as ADC. In the other word, a DAC is integrated into the ADC, featuring the same resolution of the ADC. The complexity of the ADC system increases as the quantization bits of the ADC increases. Therefore, this technology is limited for high-resolution analog-to-digital converters.

SUMMARY OF THE DISCLOSURE

It is an object of the invention to provide a dither circuit for high-resolution analog-to-digital converters which improves dynamic performance and lower complexity for ADC system.

The invention presents the following schemes to accomplish the foregoing objects of the invention:

A dither circuit for high-resolution analog-to-digital converters is provided, comprising a settable pseudorandom sequence generator, a trimming module, a trimmable digital-to-analog conversion circuit, a dither introduced circuit and a dither elimination circuit, wherein, The settable pseudorandom sequence generator works to generate settable pseudorandom sequence signals uncorrelated to analog input signal Vi, of which n-bit signal is taken as digital dither signal Dd and n is no larger than quantization bit N of the ADC; the digital dither signal Dd is output to the trimmable digital-to-analog conversion circuit and dither elimination circuit;

The trimming module is used to determine the values of trim signals X1, X2 . . . Xm, which are used to calibrate the trimmable digital-to-analog conversion circuit;

The trimmable digital-to-analog conversion circuit is under the control of the trimming signals X1, X2, . . . , Xm from the trimming module and is used to convert the digital dither signal Dd into analog dither signal Ad being output to the dither introduced circuit;

The dither introduced circuit is used to receive the analog dither signal Ad and analog input signal Vi, then output analog signals to N-bit ADC to be quantized. The dither elimination circuit works to receive digital dither signal Dd and remove dither signals from the output of analog-to-digital converter in ways that obtain the final output DOUT.

A dither circuit for high-resolution analog-to-digital converters features a settable pseudorandom sequence generator generating n-bit digital dither signal Dd and the output can be set, wherein n is no more than quantization bit N of analog-to-digital converter (n≤N). Low resolution DAC can be used instead of the conventional DAC which features the same number of quantization bits of the ADC. So it helps to decrease the complexity of the ADC system. The dither circuit has a trimming module and a trimmable DAC, wherein by using the trimming module, the trimming signals X1, X2, . . . , Xm of the trimmable DAC is precisely determined to calibrate the trimmable DAC circuit in ways that guarantee that the dither voltages in analog domain match the dither digital signals in digital domain and the dither signal is precisely removed from the output of analog-to-digital converters with no increase of the complexity but better SFDR of 10 dB. Therefore, the dither circuit is provided to improve dynamic performance of high-resolution analog-to-digital converters.

Furthermore, the settable pseudorandom sequence generator comprises a signal generation control module to set the generated pseudorandom sequence signals.

Furthermore, the signal generation control module consists of n control units, wherein, each control unit comprises a NAND gate and a data selector; a NAND gate has two inputs respectively being connected to the control signal Z1 and one bit output of pseudorandom sequence generator, and its output is connected to one input end of the data selector; the data selector has an output, a control signal Z2 and two inputs with one input being connected to the low voltage level "0" under the control of the control signal Z2. Its output is the final output of the settable pseudorandom sequence generator.

Furthermore, the trimmable digital-to-analog conversion circuit includes first input end, second input end, third input end and output end, wherein, the first input end is used to receive the digital dither signal Dd, the second input end is used to receive the external trimming signal X1, X2, ..., Xm; the third input end is used to receive reference voltage Vref of the ADC; the output end is used to output the analog dither signal Ad after conversion, and $A_d = V_{ref} \times D_d \times f(T_x)$ Wherein, Tx denotes the value of trimming signals X1, X2 ... Xm; f(Tx) is a linear function, which means that it decreases or increases as Tx changes.

Furthermore, the trimmable digital-to-analog conversion circuit comprises a reference current generation module, a reference voltage trimming module and a digital-to-analog converter module. The reference current generation module is used to generate a reference current Iref which is related to the reference voltage Vref of the analog-to-digital converter; the reference voltage trimming module works to generate a reference voltage VF of the digital-to-analog converter based on the reference current Iref and the trimming signals X1, X2, ..., Xm; the digital-to-analog converter works to generate analog dither signal Ad according to the reference voltage VF of the digital-to-analog converter and digital dither signal Dd.

Furthermore, the reference current generation module consists of first divider resistor, second divider resistor, a load resistor, an operational amplifier and an NMOS transistor. The positive input end of the operational amplifier is connected to the node between the first and second divider resistors in series; the output end of the operational amplifier is connected to the gate of the NMOS transistor; the drain of the NMOS transistor is connected to the reference voltage trimming module; both the source of the NMOS transistor and the negative input end of the operational amplifier are connected to one end of the load resistor; the other end of the load resistor is grounded.

Furthermore, the reference voltage trimming module consists of a current reference, current mirror module and the fourth resistor. The current mirror module comprises a first PMOS transistor and multiple groups of current mirror circuits in parallel, wherein each group of current mirror circuit has several groups of current mirror units in parallel; each group of current mirror unit in parallel comprises a second PMOS transistor and a third PMOS transistor; the current reference is connected to the gate and drain of the first PMOS transistor; the gate of the second PMOS transistor is connected to the gate of the first PMOS transistor; the source of the second PMOS transistor is connected to the source of the first PMOS transistor; the drain of the second PMOS transistor is connected to the source of the third PMOS transistor; the gate of the third PMOS transistor is correspondingly connected to the trimming signal X1, X2, ..., Xm; the drain of the third PMOS transistor is connected to one end of the fourth resistor. The other end of the fourth resistor is grounded.

Furthermore, the current mirror module consists of m groups of current mirror in parallel, wherein the first group of current mirror consists of one group of current mirror unit in parallel and is controlled by the trimming signal X1; the second group of current mirror consists of two groups of current mirror units in parallel and is controlled by the trimming signal X2; the third group of current mirror circuit consists of four groups of current mirror units in parallel and is controlled by the trimming signal X3; Likewise, it can be concluded that the mth group of current mirror consists of 2m−1 groups of current mirror units in parallel and is controlled by the trimming signal Xm.

Furthermore, either the dither introduced circuit is an addition circuit and the dither elimination circuit is a subtraction circuit, or the dither introduced circuit is a subtraction circuit and the dither elimination circuit is an addition circuit.

Furthermore, the trimming module works as following steps:

S21, set the analog input signal Vi of N-bit ADC at a fixed level, or disconnect the analog input of the N-bit ADC;

S22, set the output Dd of the settable pseudorandom sequence generator to be zero, a digital quantization representation D0 can be obtained by averaging multiple outputs of the ADC's final output DOUT;

S23, set the output Dd of said settable pseudorandom sequence generator at a fixed output DT;

S24, set trimming signal TX as T1, a digital quantization representation D1 can be obtained by averaging multiple outputs of the ADC's final output DOUT;

S25, set trimming signal TX as T2, T2≠T1, a digital quantization representation D2 can be obtained by averaging multiple outputs of the ADC's final output DOUT;

S26, based on D0, D1, D2, T1 and T2, the trimming code TC is determined according to the equation $$\frac{D_2 - D_1}{D_0 - D_1} = \frac{T_2 - T_1}{T_C - T_1}.$$

DETAILED DESCRIPTION OF THE DISCLOSURE

Hereinafter, the preferred embodiments of the invention will be described using the drawings for better understanding of the invention. It should be understood that the following embodiments are provided just for describing the invention, instead of limiting the property protection scope of the invention.

Figure 1:
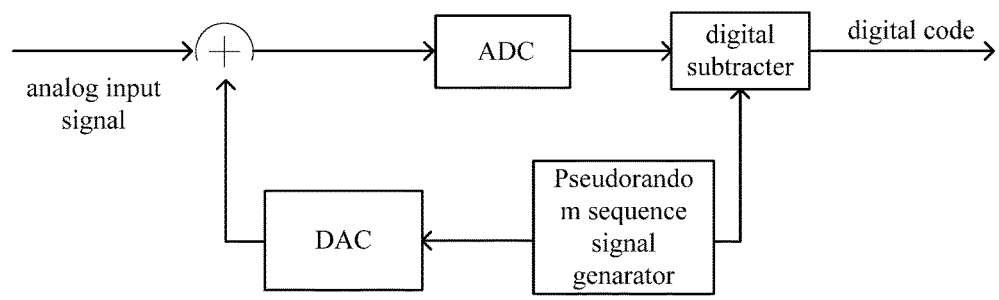
FIG. 1 is a schematic diagram of a conventional noise dither technique.
Figure 2:
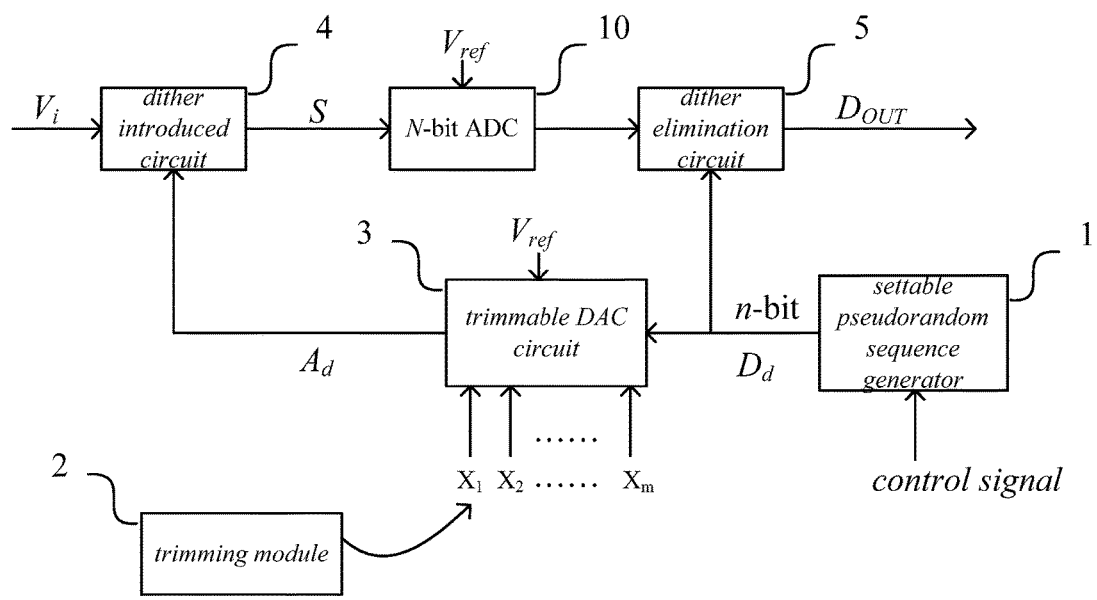
FIG. 2 is a schematic diagram of a novel dither circuit for high-resolution analog-to-digital converters in the invention.

As shown in FIG. 2, N-bit analog-to-digital converter 10 is as a "Black box" system, and such system is assumed monotonic. Specifically, a dither circuit for high-resolution analog-to-digital converter is provided, which including a settable pseudorandom sequence generator 1, a trimming module 2, a trimmable DAC circuit 3, a dither introduced circuit 4 and a dither elimination circuit 5, wherein, The settable pseudorandom sequence generator 1 works to generate settable pseudorandom sequence signals uncorrelated to analog input signal Vi, of which n-bit signal is taken as digital dither signal Dd and n is no larger than quantization bit N of the ADC; the digital dither signal Dd is output to the trimmable digital-to-analog conversion circuit 3 and dither elimination circuit 5;

The trimming module 2 is used to determine certain values of trimming signals X1, X2, . . . , Xm, which are used to calibrate the trimmable digital-to-analog converter 3;

The trimmable digital-to-analog converter 3 is under the control of the trim signals X1, X2, . . . , Xm from the trimming module, and is used to convert the digital dither signal Dd into analog dither signal Ad being output to the dither introduced circuit 4;

The dither introduced circuit 4 is used to receive the analog dither signal Ad and analog input signal Vi, then output analog signals to N-bit ADC 10 to be quantized.

The dither elimination circuit 5 works to receive digital dither signal Dd and remove dither signals from the output of analog-to-digital converter 10 in ways that obtain the final output DOUT.

A dither circuit for high-resolution analog-to-digital converters features a settable pseudorandom sequence generator generating n-bit digital dither signal Dd, wherein n is no more than quantization bit N of analog-to-digital converter (n≤N). Low resolution DAC can be used instead of the conventional used DAC which features the same number of quantization bits of the ADC. So it helps to decrease the complexity of the ADC system. The dither circuit has a trimming module and a trimmable DAC, wherein by using the trimming module, the trimming signals X1, X2, . . . , Xm of the trimmable DAC is precisely determined to calibrate the trimmable DAC circuit in ways that guarantee that the dither voltages in analog domain match the dither digital signals in digital domain and the dither signal is precisely removed from the output of analog-to-digital converters with no increase of the complexity but better SFDR of 10 dB. Therefore, the dither circuit is provided to improve dynamic performance of high-resolution analog-to-digital converters.

As an embodiment, the settable pseudorandom sequence generator 1, shown in FIG. 2, besides the conventional functions of the pseudorandom sequence generator, works to set output at two modes at least, which are all low voltage level '0' and certain fixed voltage level (e.g. all high voltage level '1') according to the control signal, the control signal is a digital signal. In order to realize the settable function, the settable pseudorandom sequence generator 1 features a signal generation control module working to set the output pseudorandom sequence signals. Specifically, the settable pseudorandom sequence generator 1 works to generate a settable pseudorandom sequence signal uncorrelated to analog input signal Vi and the output can be set, of which n-bit signal is taken as digital dither signal Dd and n is no larger than quantization bit N of analog-to-digital converters; the digital dither signal Dd is output to the trimmable digital-to-analog converter 3 for digital-to-analog conversion and dither elimination circuit 5 to eliminate the effect of the dither signals on ADC outputs. The n is no more than the quantization bit N of the analog-to-digital converter, n≤N. In the other word, low resolution DAC can be used to take the place of the conventional DAC featuring the same quantization bits of the ADC in a way that decreases the complexity of the ADC system. It must be understood that, on the condition that n-bit dither signal is converted into analog signals when n<N, the reference voltage of DAC circuit is no longer the reference voltage Vref of N bit analog-to-digital converter 10. A calibration must be taken for the reference voltage of DAC.

Figure 3:
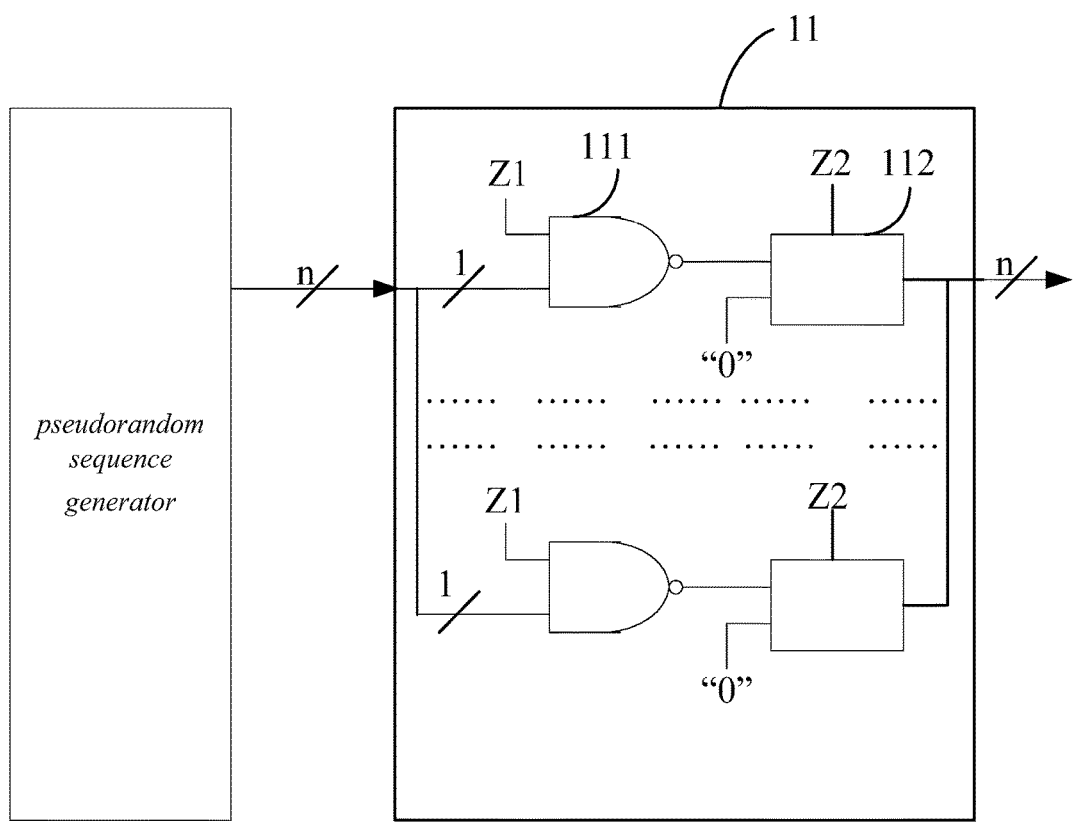
FIG. 3 is a schematic diagram of a settable pseudorandom sequence generator in FIG. 2.

Based on the conventional pseudorandom sequence generator, the settable pseudorandom sequence generator 1 features a settable function with a signal generation control module. As an embodiment, the signal generation control module 11, as shown in FIG. 3, comprises n control units, wherein, each control unit has a negative-AND (NAND) gate 111 and a data selector 112; a NAND gate 111 has two inputs respectively being connected to the control signal Z1 and one bit output of pseudorandom sequence generator, and the output of the NAND gate 111 is connected to one input end of the data selector 112; the data selector 112 has a control signal Z2, an output and two inputs, one input end of the data selector 112 being connected to the low voltage level "0". And the output of the data selector 112 is the final output of the settable pseudorandom sequence generator. As digital dither signal features n bits, n bits of output signals from the pseudorandom sequence generator are connected to the signal generation control module in the same manner.

As an embodiment, the control signal Z1 and Z2 are digital signals. Specifically, when control Z1 is a high voltage level, the output of NAND gate 111 is a low voltage level; when the control signal Z1 is a low voltage level, the output of NAND gate 111 is a reversed voltage signal of the output signal from the pseudorandom sequence generator. When control signal Z2 is a high voltage level, the output of the selector 112 is a low level voltage "0". When the control signal Z2 is a low level, the output signal of the selector 112 is the output signal of NAND gate 111. Therefore, as shown in FIG. 3, when the control signal Z1 is a high level and the control signal Z2 is a low level, the output of the settable pseudorandom sequence generator 1 is a pseudorandom sequence signal; when the control signal Z1 is a low level and the control signal Z2 is a low level, the outputs of the settable pseudorandom sequence generator 1 are all high voltage level '1'; when the control signal Z2 is a high voltage level, the outputs of the settable pseudorandom sequence generator 1 are all low voltage level '0'. In this manner, the settable function of the settable pseudorandom sequence generator 1 is realized. Obviously, the structure of the signal generation control module 11 is not limited to this. Based on the embodiments shown above, technologists in this field are able to realize the settable function by using other logic structure. As an embodiment, the trimmable DAC circuit 3 shown in FIG. 2 features that the output is not only related to the input but also controlled by the trimming signal X1, X2 . . . Xm. When the trimming signals X1, X2 . . . Xm are precisely determined by the trimming module 2, the trimmable DAC circuit 3 can be calibrated, so the DAC circuit is able to precisely convert digital dither signals into analog dither signals. In order to realize the above function, the trimmable DAC circuit 3 comprises first input end, second input end, third input end and an output end; the first input end works to receive the digital dither signal Dd; the second input end is used to receive the external trimming signal X1, X2, . . . , Xm, the trimming signal is a binary signal, namely a digital signal, which can be precisely determined by the trimming module 2; the third input end is used to receive the reference voltage Vref of N-bit analog-to-digital converter 10. The output end works to output the converted analog dither signal Ad into the dither introduced circuit 4. Wherein the relation of the input and the output is characterized in that:

The output Ad of the trimmable DAC circuit 3 linearly increases or decreases as the input trimming signal X1, X2, . . . , Xm changes. Therefore, considering the same digital dither signal Dd, the corresponding analog dither signal Ad can be obtained precisely by adjusting the trimming signals X1, X2, . . . , Xm;

The output Ad of the trimmable DAC circuit 3 is linearly related to the input of the digital dither signal Dd;

The output Ad of the trimmable DAC circuit 3 is related to the reference voltage Vref of the analog-to-digital converter 10.

Then the input-output relation of the trimmable DAC circuit 3 is expressed as equation (1):

$$A_d = V_{ref} \times D_d \times f(T_X) \qquad (1)$$

Wherein, TX denotes the value of trimming signals X1, X2 . . . Xm. For example, if X1 is the lowest bit and Xm is the highest bit, then TX is expressed as 2m−1Xm+ . . . +21X2+20X1 or 2m−2Xm+ . . . +20X2+2−1X1. Likewise, the expression of TX is not limited this. In equation (1), f(TX) is a linear function, which means that it decreases or increases linearly as the trimming signal Tx changes.

Figure 4:
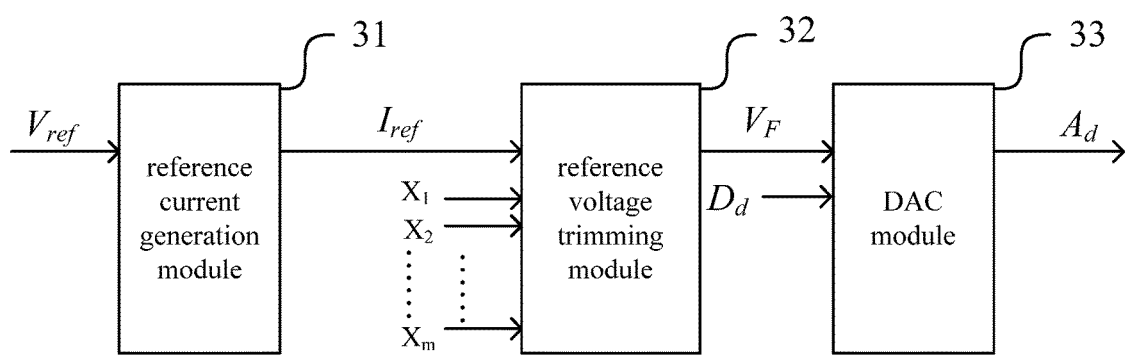
FIG. 4 is a schematic diagram of a trimmable digital-to-analog conversion circuit in FIG. 2.

As an embodiment, the trimmable DAC circuit 3 is shown in FIG. 4, comprising a reference current generation module 31, a reference voltage trimming module 32 and a DAC module 33. The reference current generation module 31 is used to generate a reference current Iref which is related to the reference voltage Vref of analog-to-digital converters 10; the reference voltage trimming module 32 works to generate a reference voltage VF of digital-to-analog converters based on the reference current Iref and the trimming signals X1, X2, . . . , Xm; the digital-to-analog converter 33 works to generate analog dither signal Ad according to the reference voltage VF of the digital-to-analog converters and digital dither signal Dd. Specifically, as for the reference current generation module 31, the reference current Iref can be expressed as equation (2):

$$I_{ref} = k_1 \times V_{ref} \qquad (2)$$

Wherein, K1 is a proportional factor.

The reference current Iref and the trimming signals X1, X2, . . . , Xm are transferred to the reference voltage trimming module 32 to generate a reference voltage VF of the trimmable DAC circuit. The reference voltage VF is expressed as equation (3):

$$V_F = k_2 \times I_{ref} \times T_X \times R \qquad (3)$$

Wherein, K2 is a proportional factor, TX denotes the value of trimming signal, R denotes the value of a resistance.

The reference voltage VF and digital dither signal Dd are sent to the DAC module 33 to generate the output analog dither signal Ad.

Typically, the output analog dither signal Ad of a DAC can be expressed as equation (4)

$$A_d = k_3 \times V_F \times D_d \qquad (4)$$

Wherein, K3 is a proportional factor, $D_d$ is digital dither signal.

According to equation (2)~(4), equation (5) is expressed as follows:

$$A_d = V_{ref} \times D_d \times k_1 \times k_2 \times k_3 \times R \times T_X \qquad (5)$$

Obviously, the expression (5) satisfies the input-output relation of the trimmable DAC circuit 3 expressed as equation (1), wherein according to equation (5) and (1) and the relation between the input and output of the trimmable DAC circuit 3, $f(T_X) = k_1 \times k_2 \times k_3 \times R \times T_X$.

Figure 5:
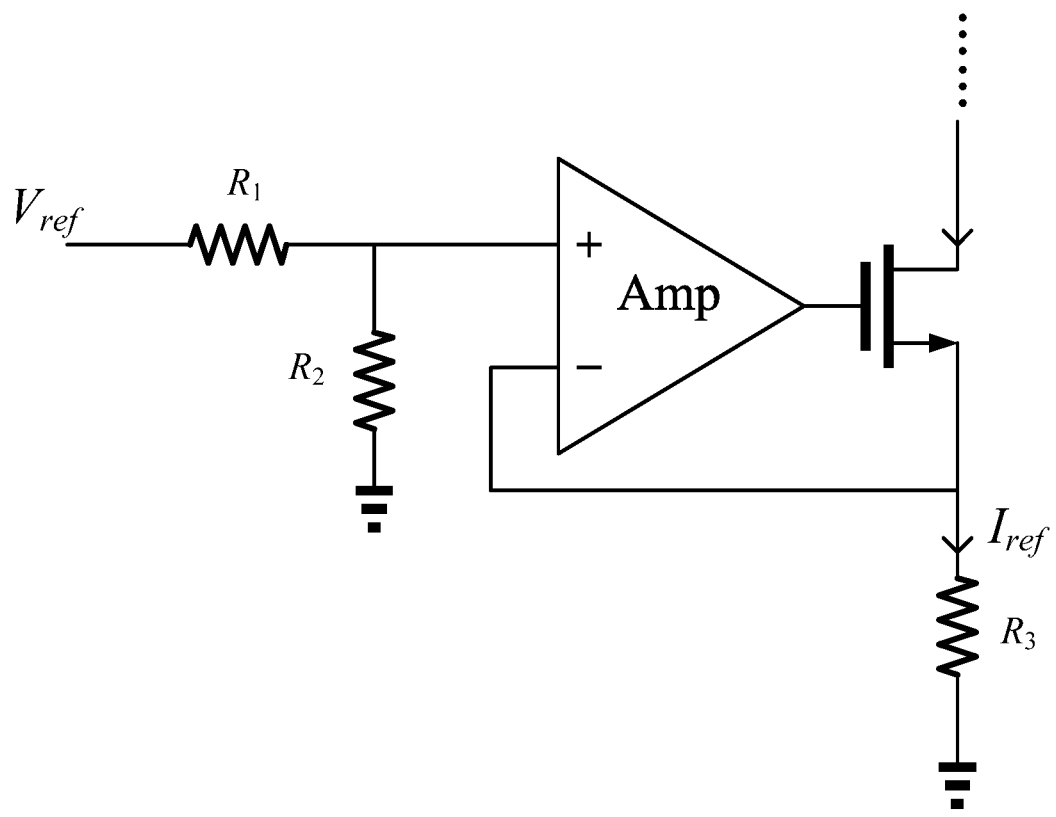
FIG. 5 is a circuit diagram of a reference current generation module in FIG. 3.

As an embodiment, the reference current generation module 31 is shown in FIG. 5, comprising first divider resistor R1, second divider resistor R2, a load resistor R3, an operational amplifier Amp and a NMOS (n-channel metal-oxide-semiconductor field effect transistor) transistor. The positive input end (+) of the operational amplifier is connected to the node between the first R1 and second R2 divider resistors in series; the output end of the operational amplifier Amp is connected to the gate of the NMOS transistor; the drain of the NMOS transistor is connected to the reference voltage trimming module 32; both the source of the NMOS transistor and the negative input end (−) of the operational amplifier Amp are connected to one end of the load resistor R3; the other end of the load resistor R3 is grounded. Specifically, the reference voltage Vref of the analog-to-digital converter 10 is connected to the positive input end of the operational amplifier Amp through divider resistors R1 and R2 in ways that take the positive input end voltage of the operational amplifier Amp as an divide voltage of the reference voltage Vref; the gate of the NMOS transistor is connected to the output end of the operational amplifier Amp. And the source of the NMOS transistor is connected to the negative input end of the operational amplifier Amp and to one end of the load resistor R3. In this way, the gate-source voltage of the NMOS transistor is stable and then can generate a stable reference current Iref. The reference current Iref works as a reference current for the reference voltage trimming module 32 which is connected to the drain of the NMOS transistor. As for the reference current generation module 31 in the embodiment, the negative input voltage of the operational amplifier Amp approximately equals to the positive input voltage (namely reference voltage divider), as the operational amplifier Amp features virtual ground. The reference voltage divider is added to the load resistor R3 which generates a reference current Iref being expressed as equation (6):

$$I_{ref} = \frac{R_2}{(R_1 + R_2) \times R_3} \times V_{ref} \qquad (6)$$

Obviously, equation (6) is fit for the reference current generation module 31 as shown in equation (2), wherein $$\frac{R_2}{(R_1 + R_2) \times R_3}$$

denotes the proportional factor K1.

Figure 6:
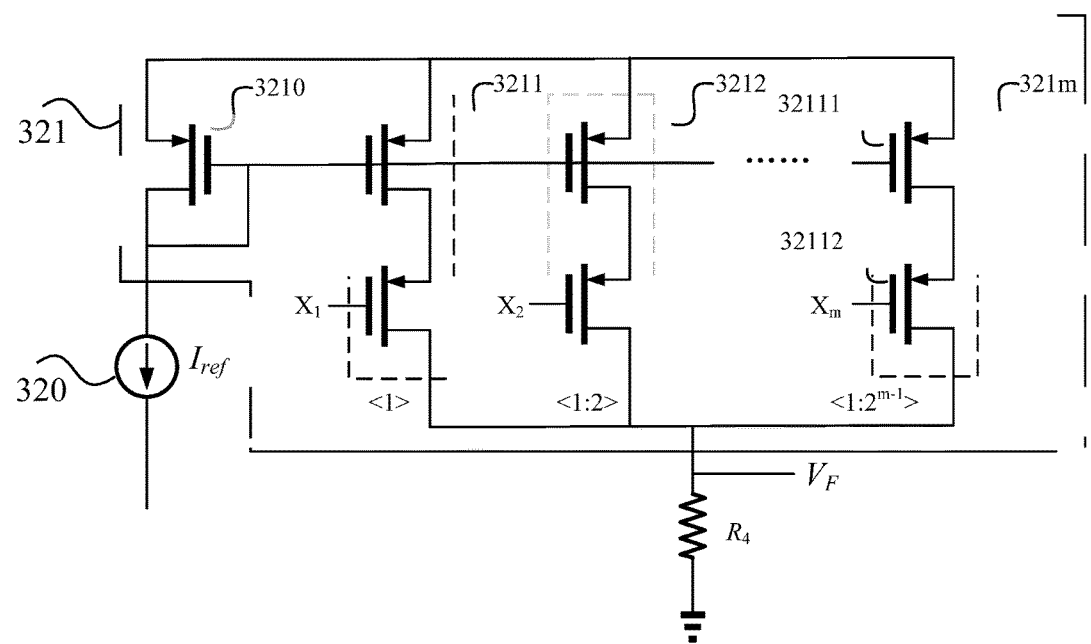
FIG. 6 is a circuit diagram of a reference voltage generation module in FIG. 3.

As an embodiment in FIG. 6, the reference voltage trimming module 32 comprises a current reference 320, current mirror module 321 and fourth resistor R4; the current reference 320 is generated by the reference current generation module 31; The current mirror module 321 comprises first PMOS (p-channel metal-oxide-semiconductor field effect transistor) transistor 3210 and multiple groups of current mirror 3211~321m in parallel, wherein each group of current mirror has several groups of current mirror units in parallel. Holistically, all the current mirror units of the current mirror are connected in parallel and each group of current mirror unit in parallel comprises a second PMOS transistor 32111 and a third PMOS transistor 32112; the first PMOS transistor 3210 is diode-connected. the current reference 320 is connected to the gate and drain of the first PMOS transistor 3210; the gate of the second PMOS transistor 32111 is connected to the gate of the first PMOS transistor 3210; the source of the second PMOS transistor 32111 is connected to the source of the first PMOS transistor 3210; the drain of the second PMOS transistor 32111 is connected to the source of the third PMOS transistor 32112; the gate of the third PMOS transistor 32112 is correspondingly connected to the trimming signal X1, X2, ..., Xm; the drain of the third PMOS transistor 32112 is connected to one end of the fourth resistor R4. The other end of the fourth resistor R4 is grounded. Obviously, based on the embodiment, similar circuit structures can be used by the technologists in the field to realize the function of the reference voltage trimming module 32. For example, PMOS transistors can be replaced by NMOS transistors with corresponding changes to the current mirror module 321.

As an preferred embodiment, referring to FIG. 6, the current mirror module 321 consists of m groups of current mirror 3211~321m in parallel, wherein the first group of current mirror 3211 consists of one group of current mirror unit in parallel and is controlled by the trimming signal X1; the second group of current mirror 3212 consists of two groups of current mirror units in parallel and is controlled by the trimming signal X2; the third group of current mirror should consist of four groups of current mirror units in parallel and be controlled by the trimming signal X3; Likewise, the conclusion is made that the mth group of current mirror 321m consists of 2m−1 groups of current mirror units in parallel and is controlled by the trimming signal Xm. As for this embodiment, when one group of current mirror consists of more than one group of current mirror units, the gates of the third PMOS transistors 32112 in each group of current mirror units are respectively connected to the corresponding trimming signal X1, X2 ... Xm and controlled by the trimming signals.

FIG. 6 is showing the circuit diagram of the reference voltage trimming module 32. When the trimming signal is a high voltage level, the third PMOS transistor 32112 of the current mirror units is off without current going through. When the trimming signal is a low voltage level, the second PMOS transistor 32111 of the current mirror unit is on, and current goes through this group of the current mirror to the fourth resistor R4, generating the reference voltage VF of the trimmable DAC circuit, wherein the voltage VF is expressed as equation (7):

$$V_F = I_{ref} \times (2^{m-1} X_m + \ldots + 2^1 X_2 + 2^0 X_1) \times R_4 = I_{ref} \times T_X \times R_4 \quad (7)$$

Obviously, equation (7) is fit for the reference voltage trimming module 32 as shown in equation (3), wherein the proportional factor K2 is 1 and the fourth resistor R4 is correspondingly the resistor R in equation (3).

As an embodiment, referring to FIG. 2, the dither introduced circuit 4 is used to receive the analog dither signal Ad and analog input signal Vi, then produce analog signal S as output which is introduced into the input of the analog-to-digital converter 10. Wherein, the dither introduced circuit 4 works to either add the analog dither signal Ad to analog input signal Vi or subtract the analog dither signal Ad from analog input signal Vi. Therefore, either addition or subtraction circuit is used for the dither introduced circuit 4. The conventional switched-capacitor circuits can be used to realize the function. The dither elimination circuit 5 is used to receive the digital dither signal Dd. After processing, the dither signal Dd is subtracted from the output of the analog-to-digital converter 10, obtaining a final output result DOUT. When the dither introduced circuit 4 is an addition circuit, the dither elimination circuit 5 is a subtraction circuit. When the dither introduced circuit 4 is a subtraction circuit, the dither elimination circuit 5 is an addition circuit. The dither elimination circuit 5 can be realized by conventional digital adder circuit.

As for the trimmable DAC circuit 3, a low resolution DAC can be used instead of the conventional used DAC featuring the same quantization bits of the ADC, namely, quantization bit n of DAC can be smaller than quantization bit N of analog-to-digital converter; then the reference voltage VF of the trimmable DAC circuit 3 is no longer the reference voltage Vref of the N-bit analog-to-digital converter 10. So the reference voltage Vref of the trimmable DAC circuit is required to be calibrated. Dither signals can be precisely removed (i.e. the final output DOUT remains the same with or without dither signal being introduced) in digital domain only when the trimmable DAC circuit 3 being calibrated. The goal of the trimming module 2 in present application is to precisely determine a trimming code TC. When TX=TC, the final output DOUT remains the same with or without dither signal being introduced under the same analog input signal.

Supposing the dither introduced circuit 4 is an addition circuit, the dither elimination circuit 5 is a subtraction circuit. Considering the equivalent input noise voltage Vnoise and equivalent input offset voltage Voffset of the ADC system, signal S being input into the N bit ADC 10 is expressed as equation (8)

$$S = V_i + A_d + V_{noise} + V_{offset} = Vi + V_{ref} D_d \times f(T_X) + V_{noise} + V_{offset} \quad (8)$$

Figure 7:
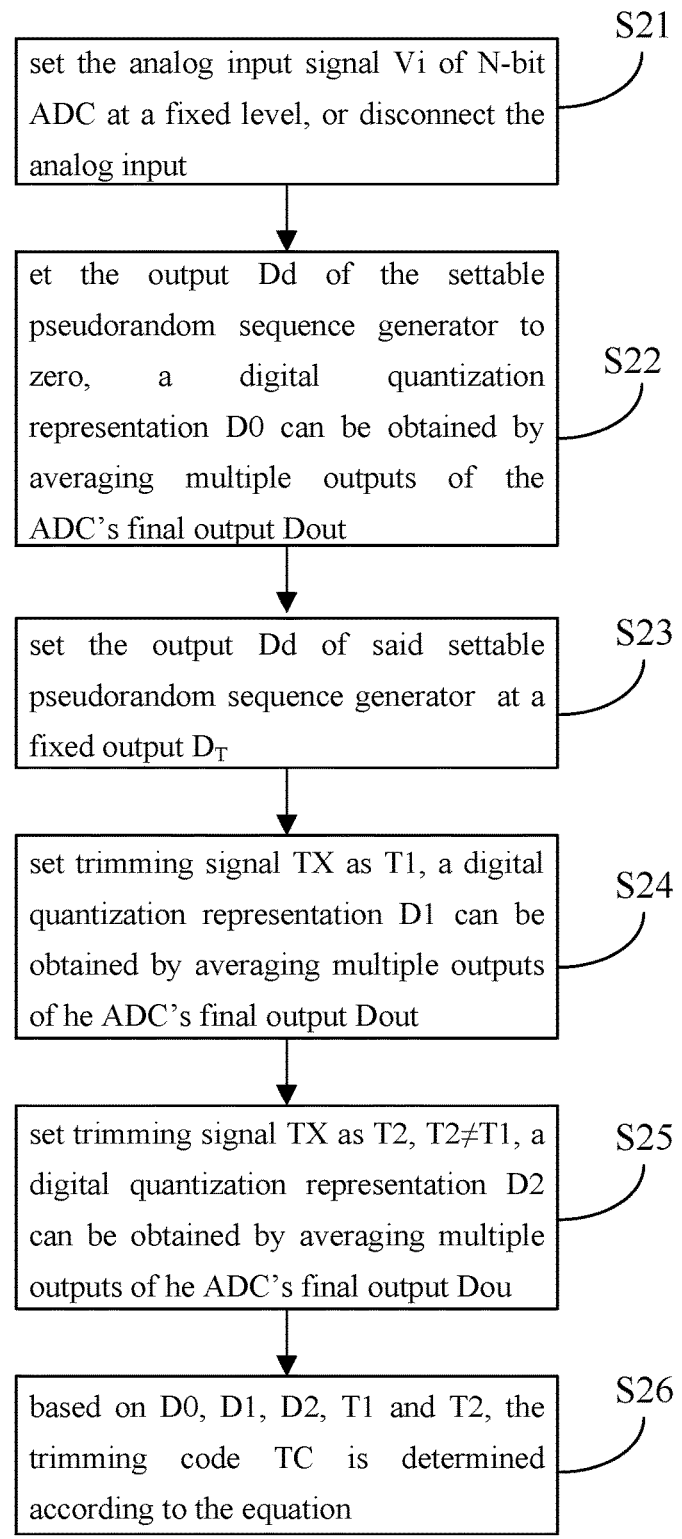
FIG. 7 is a trimming schematic flow of a trimming module in FIG. 2.

FIG. 7 shows the trimming flow of the trimming module 2, including the following steps:

S21, set the analog input signal Vi of N-bit ADC at a fixed level, or disconnect the analog input; for example, the analog input signal Vi can be set as AC grounded.

S22, set the output Dd of the settable pseudorandom sequence generator to zero, a digital quantization representation D0 can be obtained by averaging multiple outputs of the ADC's final output Dout. Under this condition, the value of Dd is zero; when analog input signal Vi is AC grounded, the signal S0 being input into N-bit ADC 10 is expressed as equation (9)

$$S_0 = V_{noise} + V_{offset} \quad (9)$$

Being effected by noise, the digital quantization results are not consistent, so multiple outputs average should be done to get the corresponding digital quantization D0, which represents the digital quantization of the noise and offset voltage.

S23, set the output Dd of said settable pseudorandom sequence generator at a fixed output $D_T$;

S24, set trimming signal TX as T1, a digital quantization representation D1 can be obtained by averaging multiple outputs of the ADC's final output Dout; When analog input signal Vi is AC grounded, the signal S1 being input into the N-bit ADC 10 is expressed as equation (10):

$$S_1 = V_{ref} \times D_T \times f(T_1) + V_{noise} + V_{offset} \quad (10)$$

Similar to step 22, being effected by noise, the digital quantization results are not consistent, so multiple outputs average should be done to get the digital quantization D1, corresponding to the signal S1.

S25, set trimming signal TX as T2, T2≠T1, a digital quantization representation D2 can be obtained by averaging multiple outputs of the ADC's final output Dout. when analog input signal Vi is AC grounded, the signal S2 being input into the N bit ADC10 is expressed as equation (11):

$$S_2 = V_{ref} \times D_T \times f(T_2) + V_{noise} + V_{offset} \quad (11)$$

Similar to step 22, being effected by noise, the digital quantization results are not consistent, so multiple outputs average should be done to get the digital quantization D2 corresponding to the signal S2.

S26, based on D0, D1, D2, T1 and T2, the trimming code TC is determined according to the equation $$\frac{D_2 - D_1}{D_0 - D_1} = \frac{T_2 - T_1}{T_C - T_1};$$

specifically, the ratio of the differences of digital quantization results equals to the ratio of the differences of the value of trimming signals, wherein digital quantization result D1 corresponds to the trimming signal T1, digital quantization result D2 corresponds to the trimming signal T2, and D0 corresponds to the trimming signal TC.

Figure 8:
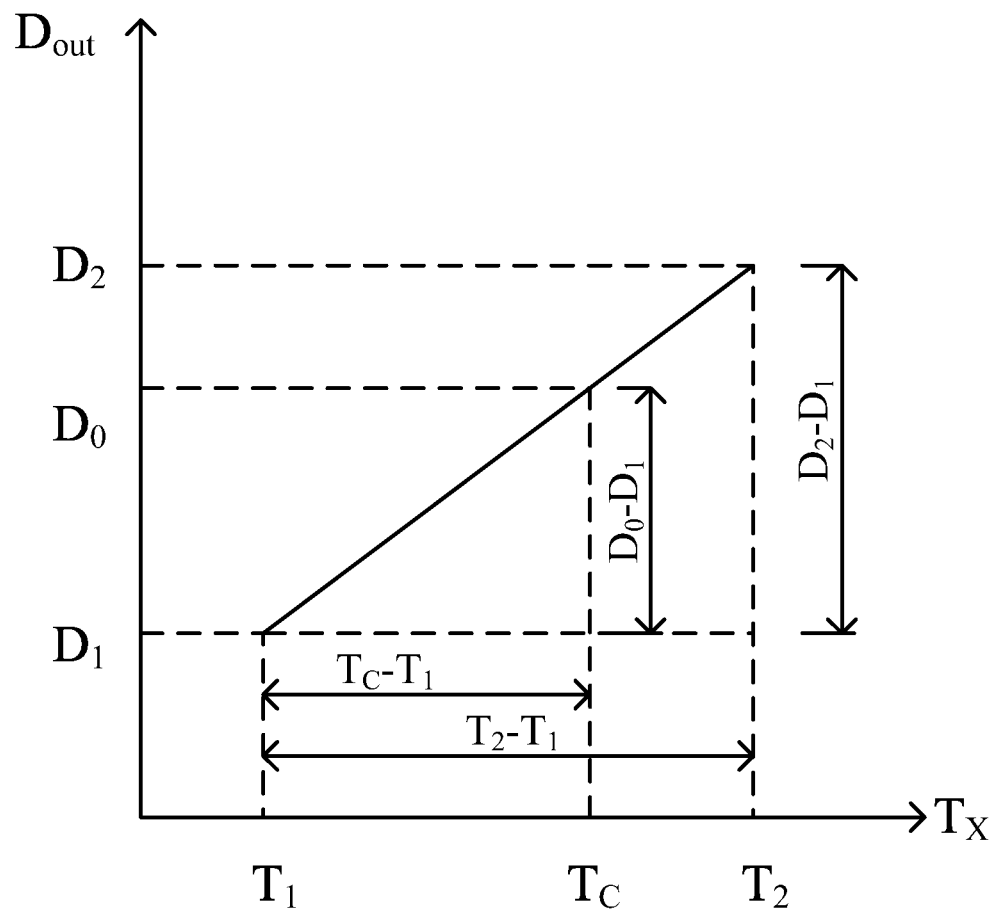
FIG. 8 is a diagram showing the relation between the final digital output DOUT and the value of trimming signal TX.

As shown in FIG. 8, the specific mode for carrying out the step 26 is described as follows:

f(Tx) decreases or increases linearly as Tx increases due to its linear property. So the analog signal S being input into the N bit ADC 10 decreases or increases linearly as Tx changes. As the ADC system features monotony, so it can be understood that the final digital output DOUT decreases or increases linearly as Tx changes. FIG. 8 is a diagram showing the relation between the final digital output DOUT and the value of trimming signal TX. As shown in FIG. 8, DOUT increases linearly as Tx increases. The value of trimming signal T1 corresponds to the digital output D1; the value of trimming signal T2 corresponds to the digital output D2; the value of trimming signal TC corresponds to the final digital output result without dither signals, namely D0. So equation (12) is concluded according to the FIG. 8:

$$\frac{D_2 - D_1}{D_0 - D_1} = \frac{T_2 - T_1}{T_C - T_1} \quad (12)$$

According to the equation (12), the trimming code TC is determined. Obviously, the relation between DOUT and TX is not limited as shown in FIG. 8, but it works in the similar manner. Likewise, it works the same way, when the dither introduced circuit 4 is a subtraction circuit and the dither elimination circuit 5 is an addition circuit.

The foregoing preferred embodiments are provided to describe, not to limit, technical approaches in the invention. Obviously, bearing the essence and concept of the invention, technologists in this field can make various changes and redesigns to the invention. It should be understood that those changes and redesigns are also covered by claims of the invention, if they are with the same purpose and within the same scope of the present invention.

What is claimed is:

1. A dither circuit for high-resolution analog-to-digital converters (ADCs), wherein comprising a settable pseudorandom sequence generator, a trimming module, a trimmable digital-to-analog conversion circuit, a dither introduced circuit and a dither elimination circuit; wherein said settable pseudorandom sequence generator works to generate settable pseudorandom sequence signals uncorrelated to analog input signal Vi, of which n-bit signal is taken as digital dither signal Dd and n is no larger than quantization bit N of the ADC; the digital dither signal Dd is output to said trimmable digital-to-analog conversion circuit and said dither elimination circuit;

said trimming module is used to determine certain values of trim signals X1, X2, ..., Xm, which are used to calibrate said trimmable digital-to-analog conversion circuit;

said trimmable digital-to-analog conversion circuit is under the control of the trim signals X1, X2, ..., Xm from said trimming module and is used to convert the digital dither signal Dd into analog dither signal Ad being output to said dither introduced circuit;

said dither introduced circuit is used to receive the analog dither signal Ad and analog input signal Vi, then output analog signals to the ADC to be quantized;

said dither elimination circuit works to receive digital dither signal Dd and remove dither signals from the output of analog-to-digital converter in ways that obtain the final output DOUT;

said settable pseudorandom sequence generator features a signal generation control module being used to set the generated pseudorandom sequence signals.

2. The dither circuit for high-resolution analog-to-digital converters according to claim 1, wherein said signal generation control module comprises n control units, wherein each control unit features a negative-AND (NAND) gate and a data selector; said NAND gate has two inputs respectively being connected to the control signal Z1 and one bit output of pseudorandom sequence generator, and the output of said NAND gate is connected to one input end of the data selector; the other input end of the data selector being connected to the low voltage level "0", the control signal of the selector is Z2, and the output of the selector is used as the final output of said settable pseudorandom sequence generator.

3. The dither circuit for high-resolution analog-to-digital converters according to claim 1, wherein said trimmable digital-to-analog conversion circuit includes first input end, second input end, third input end and output end, wherein, said first input end is used to receive said digital dither signal Dd, said second input end is used to receive the trimming signals X1, X2, ..., Xm; said third input end is used to receive reference voltage Vref of the ADC; said output end is used to output the analog dither signal Ad after conversion, and $$A_d = V_{ref} \times D_d \times f(T_x);$$

wherein, Tx denotes the value of trimming signals X1, X2 ... Xm; f(Tx) is a linear function, which means that it decreases or increases linearly as Tx changes.

4. The dither circuit for high-resolution analog-to-digital converters according to claim 3, wherein said trimmable digital-to-analog conversion circuit comprises a reference current generation module, a reference voltage trimming module and a digital-to-analog converter module, said reference current generation module is used to generate a reference current Iref which is related to the reference voltage Vref of the analog-to-digital converter; said reference voltage trimming module works to generate a reference voltage VF of said digital-to-analog converter based on said reference current Iref and said trimming signals X1, X2, ..., Xm; said digital-to-analog converter works to generate analog dither signal Ad according to said reference voltage VF of said digital-to-analog converter and digital dither signal Dd.

5. The dither circuit for high-resolution analog-to-digital converters according to claim 4, wherein said reference current generation module consists of first divider resistor, second divider resistor, a load resistor, an operational amplifier and an NMOS (n-channel metal-oxide-semiconductor field effect transistor) transistor, the positive input end of said operational amplifier is connected to the node between said first and second divider resistors in series; the output end of said operational amplifier is connected to the gate of said NMOS transistor; the drain of said NMOS transistor is connected to said reference voltage trimming module; both the source of said NMOS transistor and the negative input end of said operational amplifier are connected to one end of said load resistor; the other end of said load resistor is grounded.

6. The dither circuit for high-resolution analog-to-digital converters according to claim 4, wherein said reference voltage trimming module consists of a current reference, a current mirror module and the fourth resistor, said current mirror module comprises first PMOS (p-channel metal-oxide-semiconductor field effect transistor) transistor and multiple groups of current mirror in parallel, wherein each group of said current mirror has several groups of current mirror units in parallel; said each group of current mirror unit in parallel comprises a second PMOS transistor and a third PMOS transistor; said current reference is connected to the gate and drain of the first PMOS transistor; the gate of said second PMOS transistor is connected to the gate of said first PMOS transistor; the source of said second PMOS transistor is connected to the source of said first PMOS transistor; the drain of said second PMOS transistor is connected to the source of said third PMOS transistor; the gate of the third PMOS transistor is correspondingly connected to the trimming signals X1, X2, . . . , Xm; the drain of said third PMOS transistor is connected to one end of said fourth resistor, the other end of said fourth resistor is grounded.

7. The dither circuit for high-resolution analog-to-digital converters according to claim 1, wherein either said dither introduced circuit is an addition circuit and said dither elimination circuit is a subtraction circuit, or said dither introduced circuit is a subtraction circuit and said dither elimination circuit is an addition circuit.

8. The dither circuit for high-resolution analog-to-digital converters according to claim 1, wherein said trimming module works as following steps:
 a. set the analog input signal Vi of N-bit ADC at a fixed level, or disconnect the analog input of the N-bit ADC;
 b. set the output Dd of said settable pseudorandom sequence generator to zero, a digital quantization representation D0 can be obtained by averaging multiple outputs of the ADC's final output Dout;
 c. set the output Dd of said settable pseudorandom sequence generator at a fixed output DT;
 d. set trimming signal TX as T1, a digital quantization representation D1 can be obtained by averaging multiple outputs of the ADC's final output Dout;
 e. set trimming signal TX as T2, T2≠T1, a digital quantization representation D2 can be obtained by averaging multiple outputs of the ADC's final output Dout;
 f. based on D0, D1, D2, T1 and T2, the trimming code TC is determined according to the equation $$\frac{D_2 - D_1}{D_0 - D_1} = \frac{T_2 - T_1}{T_C - T_1}.$$

* * * * *